(12) United States Patent
RamachandraRao et al.

(10) Patent No.: US 8,080,475 B2
(45) Date of Patent: Dec. 20, 2011

(54) REMOVAL CHEMISTRY FOR SELECTIVELY ETCHING METAL HARD MASK

(75) Inventors: Vijayakumar SubramanyaRao RamachandraRao, Portland, OR (US); Kanwal Jit Singh, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 63 days.

(21) Appl. No.: 12/347,794

(22) Filed: Jan. 23, 2009

(65) Prior Publication Data
US 2010/0190347 A1    Jul. 29, 2010

(51) Int. Cl.
*H01L 21/302* (2006.01)
(52) U.S. Cl. ........ 438/691; 438/700; 438/736; 510/181; 510/255; 257/E21.219; 257/E21.245
(58) Field of Classification Search .................. 438/691, 438/692, 700, 736; 510/108, 181, 254, 255, 510/268
See application file for complete search history.

(56) References Cited

U.S. PATENT DOCUMENTS

| | | | |
|---|---|---|---|
| 2002/0031985 A1 * | 3/2002 | Wang et al. | 451/41 |
| 2006/0135045 A1 * | 6/2006 | Bian et al. | 451/36 |
| 2006/0169597 A1 * | 8/2006 | Liu et al. | 205/680 |

* cited by examiner

*Primary Examiner* — Hsien Ming Lee
(74) *Attorney, Agent, or Firm* — Winkle, PLLC

(57) ABSTRACT

Embodiments of the present invention describe a removal chemistry for removing hard mask. The removal chemistry is a wet-etch solution that removes a metal hard mask formed on a dielectric layer, and is highly selective to a metal conductor layer underneath the dielectric layer. The removal chemistry comprises an aqueous solution of hydrogen peroxide ($H_2O_2$), a hydroxide source, and a corrosion inhibitor. The hydrogen peroxide and hydroxide source have the capability to remove the hard mask while the corrosion inhibitor prevents the metal conductor layer from chemically reacting with the hydrogen peroxide and hydroxide source during the hard mask removal.

16 Claims, 8 Drawing Sheets

Imidazole 1,2,3-triazole 1,2,4-triazole

Methyl-thiol-triazole

Thiol-triazole

Triazole acid

REMOVAL CHEMISTRY FOR SELECTIVELY ETCHING METAL HARD MASK

BACKGROUND OF THE INVENTION

1. Field of the Invention

The present invention relates to the field of semiconductor processing and more particularly to a removal chemistry for selectively etching metal hard masks.

2. Discussion of Related Art

Photoresist masks are commonly used in the semiconductor industry to pattern materials such as semiconductors or dielectrics. In one application, photoresist masks are used in a dual damascene process to form interconnects in the back-end metallization of a semiconductor device. The dual damascene process involves forming a photoresist mask on a dielectric layer overlying a metal conductor layer, such as a copper layer. The dielectric layer is then etched according to the photoresist mask to form a via and/or trench that expose the metal conductor layer. The via and trench, commonly known as dual damascene structure, are usually defined using two lithography steps. The photoresist mask is then removed from the dielectric layer before a conductive material is deposited into the via and/or trench to form an interconnect.

With the decreasing size of semiconductor devices, it becomes more difficult to achieve the critical dimensions for vias and trenches. Thus, metal hard masks are used to provide better profile control of vias and trenches. The metal hard masks can be made of titanium (Ti) or titanium nitride (TiN), and are removed by a wet etching process after forming the via and/or trench of the dual damasene structure. It is essential that the wet etching process uses a removal chemistry that effectively removes the metal hard mask without affecting the underlying metal conductor layer and dielectric material. In other words, the removal chemistry is required to be highly selective to the metal conductor layer and dielectric layer.

DETAILED DESCRIPTION OF THE PRESENT INVENTION

Figure 1:
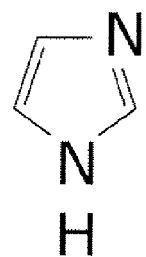
FIG. 1 illustrates the chemical structures of corrosion inhibitors used in accordance with one embodiment of the present invention.
Figure 1:
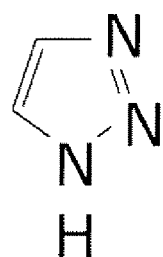
Figure 1:
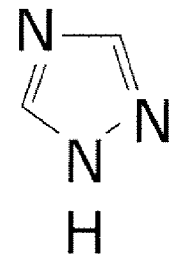
Figure 1:
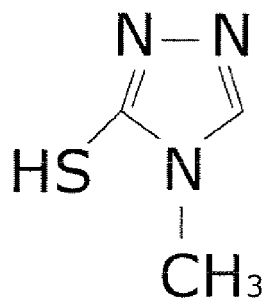
Figure 1:
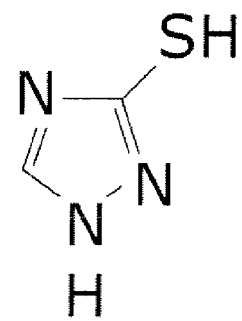
Figure 1:
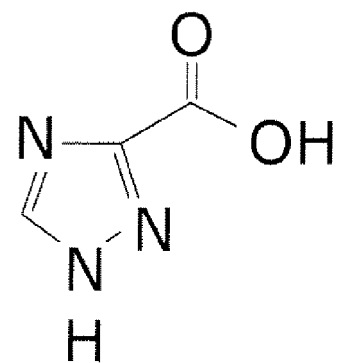

In the following description, numerous specific details are set forth in order to provide a thorough understanding of the present invention. In other instances, well known chemical formulating techniques and features has not been described in particular detail in order not to unnecessarily obscure the present invention.

Embodiments of the present invention describe a removal chemistry for removing hard mask. In one embodiment, the removal chemistry is a wet-etch solution that removes a metal hard mask on a dielectric layer and is highly selective to a metal conductor layer underneath the dielectric layer and the dielectric layer itself. In an embodiment of the present invention, the removal chemistry comprises an aqueous mixture of hydrogen peroxide ($H_2O_2$), a hydroxide source, and a corrosion inhibitor. The hydrogen peroxide and hydroxide source have the capability to chemically react with the metal hard mask to effect its removal. The corrosion inhibitor prevents the metal conductor layer from chemically reacting with the hydrogen peroxide and hydroxide source during the metal hard mask's removal. In one embodiment, the removal chemistry is used for removing metal hard mask used in a dual damascene process. The removal chemistry has the capability to effectively remove the metal hard mask formed on dielectric layer and is highly selective to the metal conductor layer underneath the dielectric layer. In one embodiment, the metal hard mask is made of titanium or titanium nitride. In one embodiment, the metal conductor layer is made of copper alloys and/or cobalt alloys.

In an embodiment of the present invention, the removal chemistry comprises an aqueous solution of hydrogen peroxide as an oxidizing agent. In one embodiment, the hydrogen peroxide has a concentration level in the range of 3% to 50% by volume. In a specific embodiment, the hydrogen peroxide has a concentration level in the range of 5% to 20% by volume. In a specific embodiment, the hydrogen peroxide has a concentration level of about 15% by volume.

In an embodiment of the present invention, the hydroxide source is a hydroxide-containing material where the OH. ion readily dissociates from the material when dissolved in aqueous solution. The hydroxide source is selected from the group consisting of potassium hydroxide, sodium hydroxide, tetramethyl-ammonium-hydroxide (TMAH) and choline hydroxide. In one embodiment, the hydroxide source has a concentration level that is sufficient to adjust the pH value of the aqueous solution containing hydrogen peroxide to at least 7.3. In one embodiment, the hydroxide source has a concentration level in the range of 50 to 1000 parts per million (ppm) by volume. In a specific embodiment, the hydroxide source has a concentration level in the range of 100 to 250 parts per million (ppm) by volume.

The corrosion inhibitor is made from a material that prevents oxidation and dissolution of the underlying metal conductor layer. In particular, the corrosion inhibitor can either attach to or be adsorbed onto the metal conductor layer in order to prevent the metal conductor layer from being oxidized and removed by the oxidizing agent. Furthermore, the corrosion inhibitor has the capability to remain highly stable in the removal chemistry. In other words, the corrosion inhibitor is not reactive to the hydrogen peroxide and the hydroxide source, preventing its disintegration in the removal chemistry.

In an embodiment of the present invention, the corrosion inhibitor has a chemical structure of a cyclical ring having at least five members. In one embodiment, the cyclical ring comprises at least two nitrogen (N) atoms. The corrosion inhibitor is selected from a group consisting of imidazole, 1,2,3-triazole, 1,2,4-triazole, methyl-thiol-triazole, thiol-triazole, and triazole acid. FIG. 1 illustrates the chemical structures of these corrosion inhibitors. For example, the 1,2,4-triazole has three nitrogen atoms, wherein each of the nitrogen atoms are able to chemicals bond with the copper or cobalt atoms of the metal conductor layer. Furthermore, the double bonds in conjunction with the nitrogen atoms in the 1,2,4-triazole facilitate chemical bonding with the copper or cobalt atoms in the metal conductor layer. In one embodiment the corrosion inhibitor does not include a benzene ring, also known as a six-carbon ring. For example, the corrosion inhibitor does not include benzotriazole or mercaptobenzimidazole.

In one embodiment, the corrosion inhibitor has a concentration level in the range of 100 to 1000 ppm by volume. In a specific embodiment, the corrosion inhibitor has a concentration level in the range of 100 to 250 ppm by volume. The corrosion inhibitor has a concentration level of at least 100 ppm so that it has sufficient amount to prevent oxidation and subsequent dissolution of the metal conductor layer. Furthermore, the corrosion inhibitor has a concentration level not more than 1000 ppm so as to prevent precipitation that forms unwanted residue.

The method of formulating the removal chemistry shall now be described. In an embodiment of the present invention, formulation of the removal chemistry begins by providing an aqueous solution of hydrogen peroxide. In one embodiment, the aqueous solution is prepared by diluting concentrated hydrogen peroxide with water ($H_2O$) to a desired concentration. For example, concentrated hydrogen peroxide is diluted to a concentration of about 3% to 5% by volume in water.

Next, the hydroxide source is added to the aqueous solution of hydrogen peroxide. In one embodiment, the hydroxide source of a desired concentration level is added to the aqueous solution of hydrogen peroxide at an ambient temperature of about 20 to 28 degrees Celsius. In one embodiment, the hydroxide source has sufficient concentration level to adjust the pH value of the aqueous solution of hydrogen peroxide to at least 7.3.

Corrosion inhibitor is then added to the aqueous solution of hydrogen peroxide and hydroxide source. In one embodiment, the corrosion inhibitor of a desired concentration level is added to the aqueous solution of hydrogen peroxide and hydroxide source at ambient temperature of about 20 to 28 degrees Celsius. In another embodiment, the corrosion inhibitor is added to the aqueous solution of hydrogen peroxide before the hydroxide source is added to the aqueous solution of hydrogen peroxide. Alternatively, the corrosion inhibitor and the hydroxide source are added to the aqueous solution of hydrogen peroxide at the same time.

In one embodiment, the removal chemistry is formulated at the point of use. For example, the removal chemistry can be mixed while being applied onto the hard mask. The removal chemistry can also be mixed or formulated before applying onto the hard mask. For example, the removal chemistry can be mixed 5-10 seconds before use. Furthermore, removal chemistry can also be mixed at about 6-8 hours before use.

In a particular embodiment of the present invention, formulating the removal chemistry comprises providing an aqueous solution of hydrogen peroxide having a concentration of about 3 to 50% by volume. Then, a hydroxide source having a concentration of about 50 to 1000 ppm by volume is added to the aqueous solution of hydrogen peroxide. A corrosion inhibitor having a concentration of about 100 to 1000 ppm by volume is then added to the aqueous solution. In one embodiment, both the hydroxide source and corrosion inhibitor are added to the aqueous solution of hydrogen peroxide at ambient temperature of about 20 to 28 degrees Celsius. In a specific embodiment, the hydrogen peroxide has a concentration of about 15% by volume, the hydroxide source is made of potassium hydroxide with a concentration of about 100 to 250 ppm by volume, and the corrosion inhibitor is made of a 1,2,4-triazole with a concentration of about 100 to 250 ppm by volume.

In an embodiment of the present invention, the removal chemistry is used to remove hard masks in a dual damascene process. The dual damascene process is commonly used to form metal interconnects in the backend metallization, which are used to electrically interconnect various electrical components formed in a semiconductor substrate into functional circuits. Electrical components refer to transistors, rectifiers, capacitors and the like, which are interconnected into functional circuits such as microprocessors, digital signal processors, embedded controllers and memory devices, such as flash memories or dynamic random access memories.

Typically, the backend metallization comprises multiple levels/layers of metal interconnects that are isolated by interlayer dielectrics. Etch stop layers are commonly formed between and/or within interlayer dielectrics for various fabrication reasons. However, the etch stop layers have high dielectric constants which increase the effective dielectric constant of the interlayer dielectrics. The etch stop layers are usually made from silicon nitride (SiN), silicon carbide (SiC), silicon carbon-containing nitrides, silicon nitrogen-containing carbides, silicon carbon-containing oxynitrides, or silicon nitrogen-containing oxycarbides (SiCON). Thus, the complete removal of the etch stop layer from the interlayer dielectrics has been considered to reduce the effective dielectric constant.

FIGS. 2A-2H illustrate a method of forming an etch-stopless dual damascene interconnect in accordance with one embodiment of the present invention. In particular, FIGS. 2A-2H illustrate a partial-via first dual damascene process. Fabrication of the dual damascene interconnect begins in FIG. 2A with a substrate 200, such as a monocrystalline silicon substrate or a silicon-on-insulator (SOI) substrate. The substrate 200 includes a plurality of electrical components such as transistors, rectifiers and capacitors. An interlayer dielectric 310 is deposited on the substrate 200 using well known techniques, such as but not limited to chemical vapor deposition (CVD) or physical vapor deposition (PVD). Interlayer dielectric 310 is made of any suitable and well known interlayer dielectric material, such as but not limited to silicon dioxide ($SiO_2$).

A metal conductor layer or metal interconnect 410 is formed in the interlayer dielectric 310. In an embodiment of the present invention, the metal interconnect 410 comprises a metal film 411 having a cap layer 412 formed thereon. In one embodiment, the metal film 411 can be made from material such as but not limited to copper, copper alloy, gold and silver. Metal film 411 can be formed by well known techniques, such as but not limited to electro-deposition.

In one embodiment, the cap layer 412 is made of a material with sufficient thickness to prevent out-diffusion of atoms from the metal film 431 into the subsequently formed interlayer dielectric 320. In a particular embodiment, the cap layer 412 has a thickness of around 2 to 10 nanometers. In an embodiment of the present invention, the cap layer 412 is made of cobalt alloys, such as but not limited to cobalt-boron-phosphorous or cobalt-tungsten-phosphorous alloys. For example, a cobalt-boron-phosphorous cap layer 412 is formed on a copper metal film 411. In another embodiment, the cap layer 412 is made of copper alloys, such as but not limited to copper-aluminum or copper-tungsten alloys. For example, a copper-aluminum cap layer 412 is formed on a copper metal film 411.

In one embodiment, the cap layer 412 is selectively deposited onto the metal film 411 and not onto the top surface of the interlayer dielectric 310. Cap layer 412 can be selectively deposited using well known techniques, such as but not limited to electroless deposition. In an embodiment of the present invention, the top surface of cap layer 412 is substantially planar with the top surface of interlayer dielectric 310 as shown in FIG. 2A.

Subsequently, an interlayer dielectric 320 is deposited over the metal interconnect 410 and the interlayer dielectric 310. In one embodiment, the interlayer dielectric 320 is made from a low-k material (k<3.6), such as but not limited to porous & non-porous carbon doped oxide. The interlayer dielectric 320 is formed by using similar techniques as the interlayer dielectric 310, and thus will not be discussed in detail here.

Figure 2A:
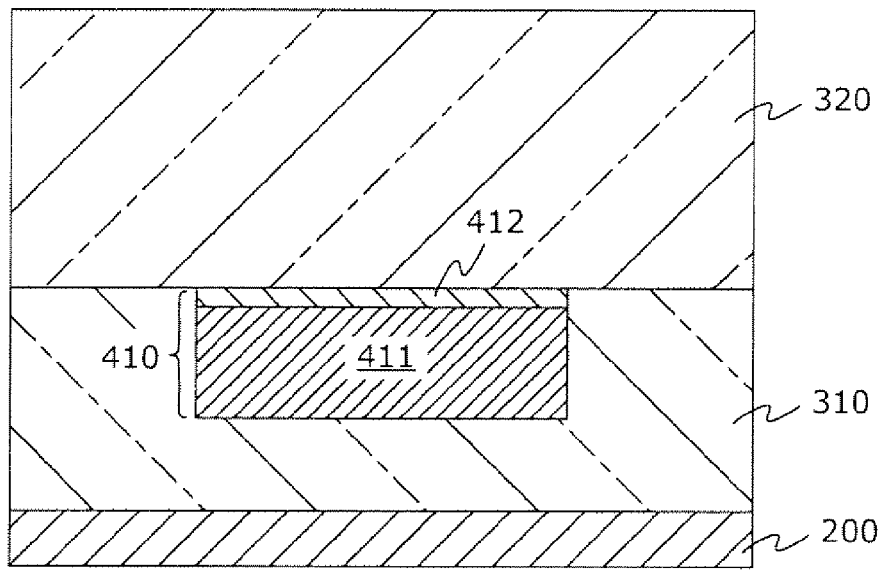
FIGS. 2A-2H are cross-sectional views that illustrate the method of forming a dual damascene interconnect in accordance with one embodiment of the present invention.

As illustrated in FIG. 2A, the interlayer dielectric 320 is formed directly onto the metal interconnect 410 and the interlayer dielectric 310 without an intermediate etch stop layer. In other words, there are no etch stop layers or high dielectric films (k>4.0) formed on top of the interlayer dielectric 310 and metal interconnect 410 before forming the interlayer dielectric 320. By not forming an etch stop layer, the effective dielectric constant of the interlayer dielectrics 310, 320, remains low to produce a high performance interconnect structure.

Figure 2B:
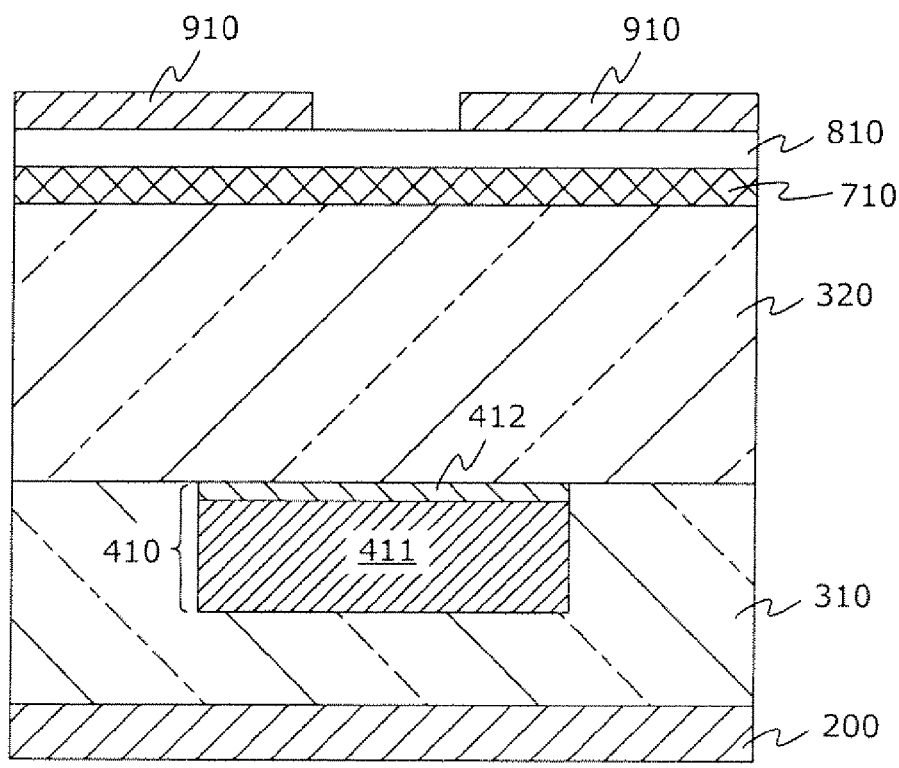

Next, a partial via opening is formed in the interlayer dielectric 320. In an embodiment of the present invention, fabrication of the partial via opening begins by depositing a metal hard mask 710 onto the interlayer dielectric 320 as shown in FIG. 2B. In one embodiment, the metal hard mask 740 is made of titanium or titanium nitride. Metal hard mask 710 can be formed by well known techniques such as but not limited to CVD or PVD. Subsequently, a silicon-based and/or carbon-based sacrificial light absorbing material or anti-reflective coating (ARC) 810 is blanket deposited on metal hard mask 710 before a photoresist mask 910 is formed on the ARC 810.

In one embodiment, the ARC 810 serves as an anti-reflective coating for the lithographic processing of the photoresist mask 910 used to define the location of the partial via opening in the interlayer dielectric 320. The ARC 810 is made from well known materials, and hence will not be discussed in detail herein. The ARC 810 can be deposited by any well known technique, such as but not limited to spin-coating.

Photoresist mask 910 is formed on SLAM 810 to define a desired location of the interlayer dielectric 320 to form the partial via opening. In one embodiment, photoresist mask 910 can be made from any well known materials, and thus will not be discussed in detail here. Photoresist mask 910 can be formed by any well known photolithography techniques, such as spin-coating, masking, exposing and developing.

Figure 2C:
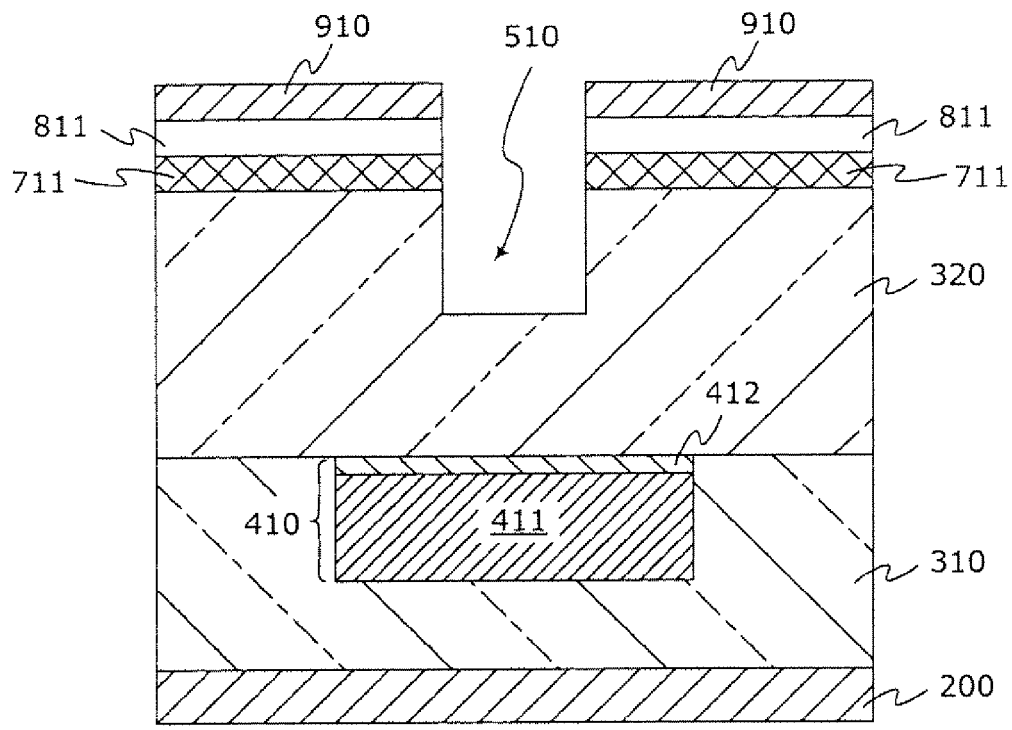

Next, in FIG. 2C, an etching process is performed in alignment with the photoresist mask 910 to form the partial via 510. Furthermore, the etching process also removes portions of the metal hard mask 710 not covered by the photoresist mask 910 to form metal hard mask 71. The etching process can be time controlled so that the partial via 510 does not extend through the interlayer dielectric 320 to expose the cap layer 412. In one embodiment, the partial via 510 is formed to a desirable depth into the interlayer dielectric 320. After forming the partial via 510, the photoresist mask 910 and remaining portions 811 of the ARC 810 are removed from the metal hard mask 711.

Figure 2D:
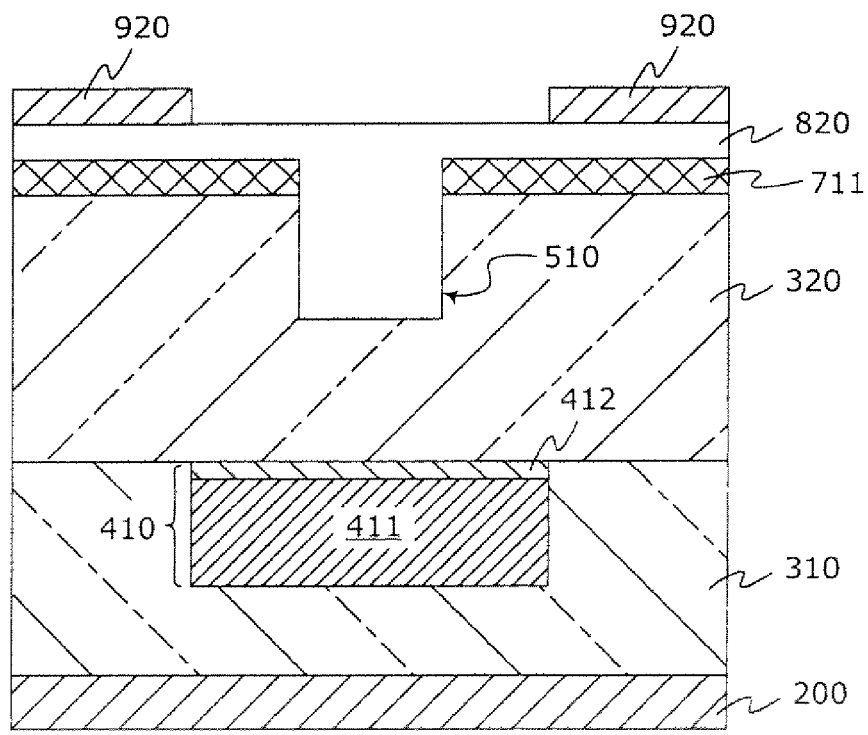

Subsequently, the metal hard mask 711 is patterned to form an opening that defines a desired region on the interlayer dielectric 320 to form a trench opening. In one embodiment, fabrication of the opening on the metal hard mask 711 begins by depositing a SLAM 820 into the partial via 510 and on top of metal hard mask 711 as shown in FIG. 2D. Then, a photoresist mask 920 is formed onto the ARC 820 to define a desired region of metal hard mask 714 to form the opening. The ARC 820 and photo resist mask 920 uses similar fabrication techniques and materials as the ARC 810 and photoresist mask 910 in FIG. 28, and thus will not be discussed in detail here.

Figure 2E:
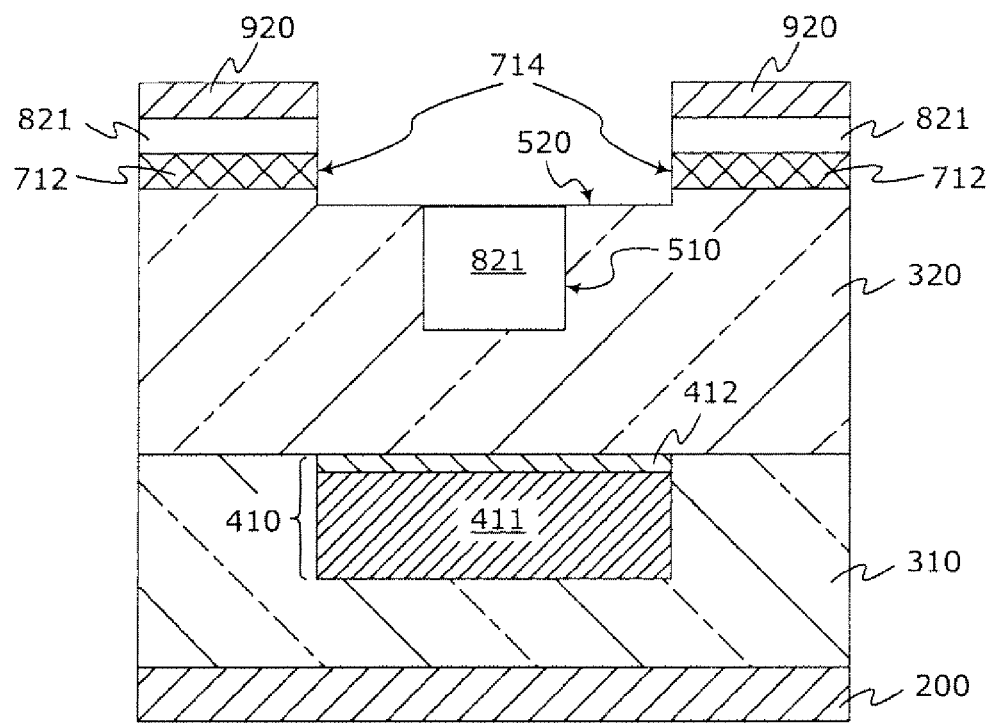
Figure 2F:
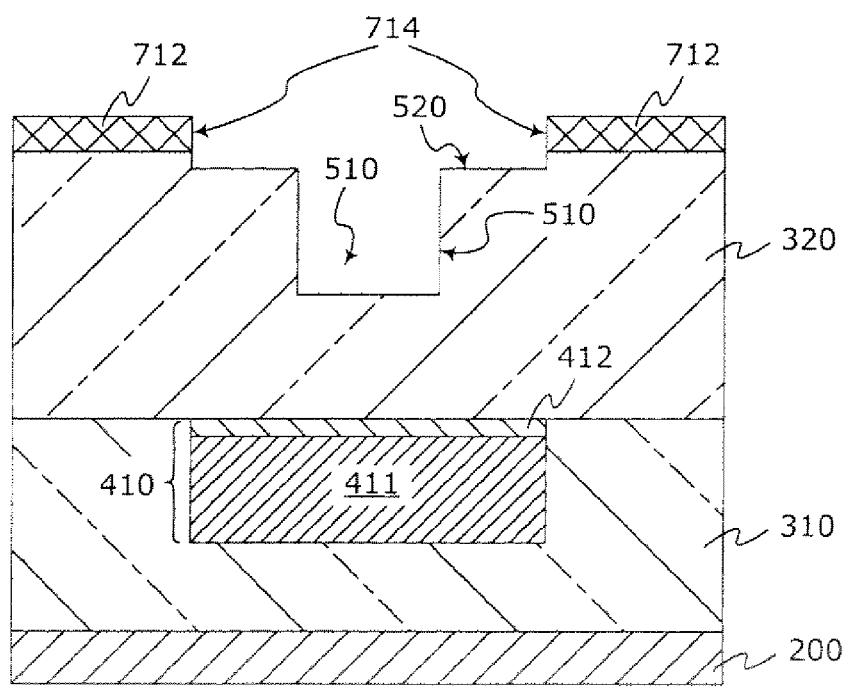

Next, in FIG. 2E, an etching process is performed in alignment with the photoresist mask 920 to form metal hard mask 712 having an opening 714. Opening 714 defines a location on the interlayer dielectric 320 for forming a trench. Furthermore, the etching process also etches portions of the ARC 820 not covered by the photoresist mask 920 so that portions 821 of ARC 810 remains in the partial via 510 and on the metal hard mask 712. In one embodiment, the etching process may result in a small over-etch into the interlayer dielectric 320 not covered by the photoresist mask 920 to form a partial trench 520. After forming the metal hard mask 712 with opening 714, the photoresist mask 920 and remaining portions 821 of the ARC 820 are removed from the metal hard mask 721 and from the partial via 510 as shown in FIG. 2F.

Figure 2G:
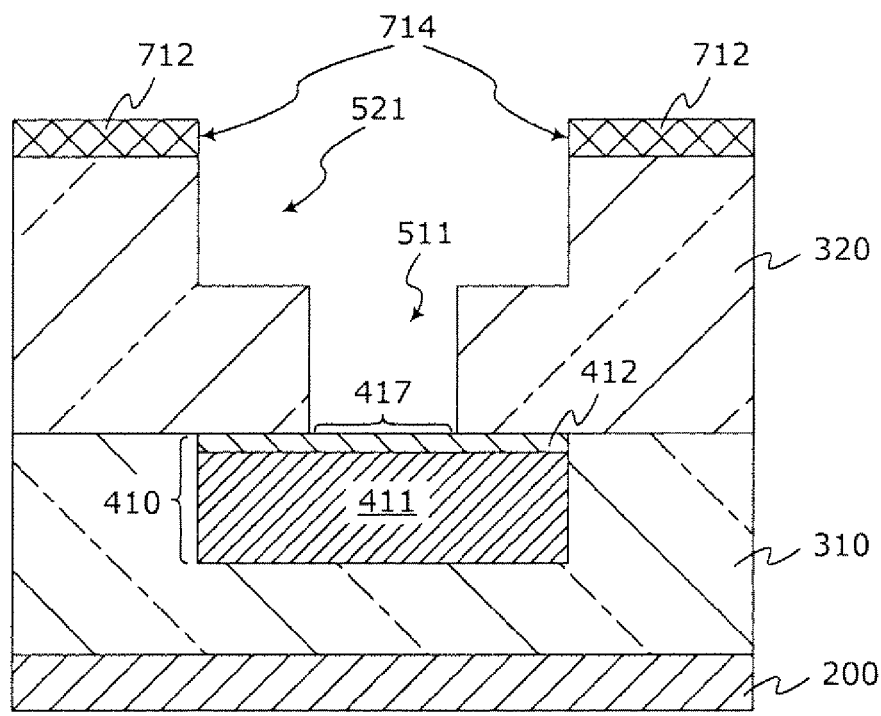

Next, an etching process is performed to form a trench and a via opening that exposes a portion of the cap layer 412. In one embodiment, an etching process extends the partial via 510 to the cap layer 412, thus forming the via opening 511 as shown in FIG. 2G. The via opening 511 exposes a portion 417 of the cap layer 412. Furthermore, the etching process also etches the interlayer dielectric 320 in alignment with the opening 714 of metal hard mask 712 to define a trench 521 above the via opening 511. In one embodiment, the etching process extends the partial trench 520 described in FIG. 2F to form the complete trench 521. In one embodiment, the etching process uses a plasma anisotropic etch to form the trench 521 and via opening 511 at the same time. Trench 521 and via opening 511 can be referred to as a dual damascene structure.

After forming both the trench 521 and via opening 511, a removal process is performed to remove the metal hard mask 712 from the interlayer dielectric 320. The removal process utilizes the removal chemistry of the present invention, which has the capability to remove the metal hard mask 712 and is highly selective to exposed portion 417 of the cap layer 412 and the dielectric 320. In other words, the removal process etches the hard task 712 without etching the cap layer 412.

In one embodiment, the removal chemistry for removing the metal hard mask 712 comprises or formed by mixing an aqueous solution of hydrogen peroxide having a concentration of about 3-50% by volume, a hydroxide source having a concentration of about 50 to 1000 ppm by volume, and a corrosion inhibitor having a concentration of about 100 to 4000 ppm by volume. In a specific embodiment, the removal chemistry comprises an aqueous solution of hydrogen peroxide having a concentration of about 15% by volume, potassium hydroxide having a concentration of about 100 to 250 ppm by volume and a 1,2,4-triazole corrosion inhibitor having a concentration of about 100 to 250 ppm by volume.

In an embodiment of the present invention, the removal chemistry can be mixed while being applied onto the metal hard mask 712. The removal chemistry can also be mixed before applying onto the metal hard mask 712. For example, the removal chemistry can be mixed 5-10 seconds before use. Removal chemistry can also be mixed at about 6-8 hours before use. In one embodiment, the removal chemistry is mixed at ambient temperature of about 20 to 28 degrees Celsius.

Removal process can be performed in an immersion mode or a spinning mode. In the immersion mode, the entire wafer is dipped into the removal chemistry to remove the metal hard mask 712. In the spinning mode, the removal chemistry is sprayed or drained onto the wafer that is spinning. In one embodiment, the removal process is performed at a temperature of about 40 to 60 degrees Celsius for a time duration of about 3 to 10 minutes to remove the metal hard mask 712.

During the removal process, both the metal hard mask 712 and the exposed portion 417 of the cap layer 412 are exposed to the removal chemistry at the same time. The removal chemistry has the capability to effectively remove the metal hard mask 712 from the interlayer dielectric 320 and is highly selective to the cap layer 412. Equations (1) to (3) illustrate some examples of the chemical reactions of hard mask dissolution in the removal chemistry. In relation to equations (1) to (3), the metal hard mask 712 is made of titanium.

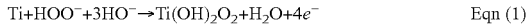
$$Ti+HOO^-+3HO^- \rightarrow Ti(OH)_2O_2+H_2O+4e^- \qquad \text{Eqn (1)}$$

$$Ti(OH)_2O_2+2H_2O \rightarrow Ti(OH)_4+HOOH \qquad \text{Eqn (2)}$$

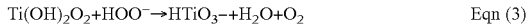
$$Ti(OH)_2O_2+HOO^- \rightarrow HTiO_3^-+H_2O+O_2 \qquad \text{Eqn (3)}$$

In equation (1), titanium (Ti) from the metal hard mask 712 reacts with hydroperoxyl radical (HOO—) from the hydrogen peroxide and hydroxyl radicals (HO—) from the hydroxide source, and results in titanium-ligand ($Ti(OH)_2O_2$), water ($H_2O$) and electrons (e–). In one embodiment, the titanium-ligand ($Ti(OH)_2O_2$) further reacts with water ($H_2O$), which results in titanium hydroxide ($Ti(OH)_4$) and HOOH, as shown in equation (2). In another embodiment, the titanium-ligand ($Ti(OH)_2O_2$) reacts with the hydroperoxyl radical (HOO—), and results in titanate ($HTiO_3$—), water ($H_2O$), and oxygen ($O_2$), as shown in equation (3). It can be appreciated that equations (1) to (3) illustrate some of the chemical reactions of the titanium hard mask dissolution in the removal chemistry and is not exhaustive. Similarly, equations (1) to (3) are also applicable in the case where the metal hard mask 712 is made of titanium nitride.

Furthermore, during the removal process the corrosion inhibitor has the capability to attach to or be adsorbed by the exposed portion 417 of cap layer 412 to prevent the exposed portion 417 from oxidation and dissolution. In the case where the corrosion inhibitor uses a 1,2,4-triazole, the three nitrogen atoms of the 1,2,4-triazole chemically bond with the copper or cobalt atoms at the surface of exposed portion 417. Furthermore, the double bonds in the 1,2,4-triazole facilitate chemical bonding with the copper or cobalt atoms. In addition, the small size of the 1,2,4-triazole molecule can easily access the exposed portion 417 in a very narrow via opening 511.

In the case where the metal hard mask 712 is made of titanium and there is no cap layer 412, the etch selectivity of the metal hard mask 712 to conduction layer 411 is about 600:1. In another case where the metal hard mask 712 is made of titanium and the cap layer 412 is cobalt-alloy, the etch selectivity of the metal hard mask 712 to cap layer 412 is about 150:1. Therefore, the removal chemistry is highly selective to the copper or cobalt alloy cap layer 412. Furthermore, it has been found that the addition of the corrosion inhibitor increased the high selectivity to copper or cobalt alloy cap layer 412 by about 10 times.

Figure 2H:
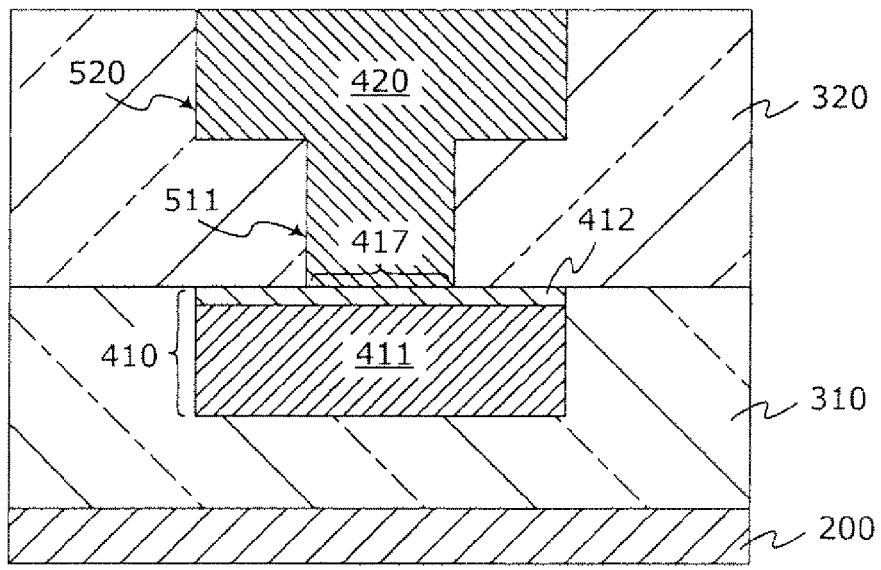

Next, a conductive layer is deposited onto the exposed portion 417 of cap layer 412 to form a metal interconnect. In one embodiment, a conductive layer is blanket deposited into the trench 521 and via opening 511 and also onto the interlayer dielectric 320. Then, the top surface of the conductive layer is planarized by well known techniques such as CMP until its top surface is substantially planar with the top surface of the interlayer dielectric 320. The portion of conductive layer left in the trench 521 and via opening 511 forms the dual damascene interconnect or metal interconnect 420 as shown in FIG. 2H.

Figure 3A:
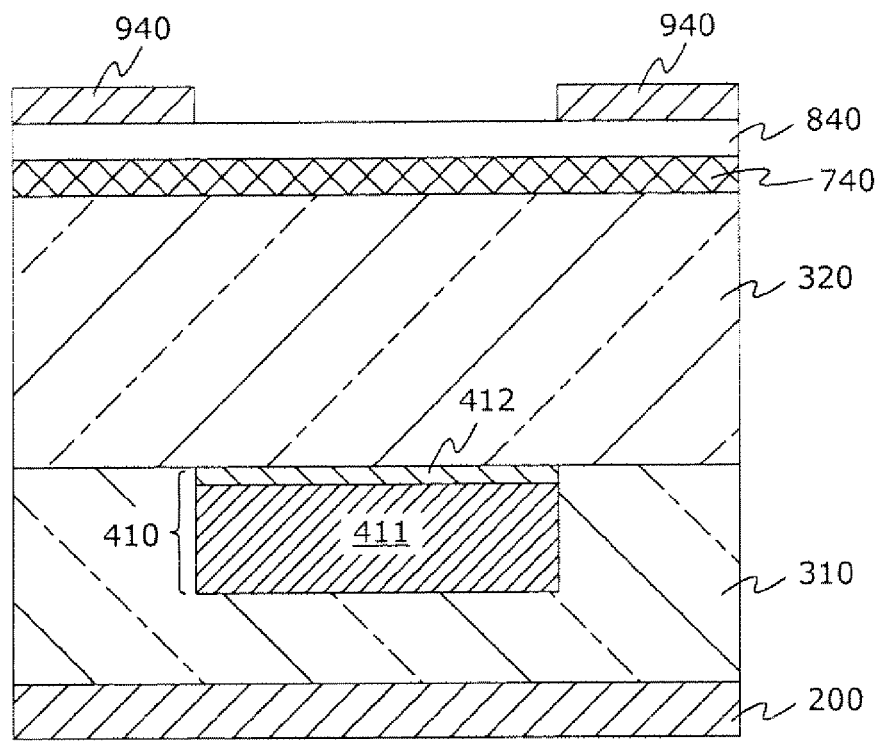
FIGS. 3A-3F are cross-sectional views that illustrate the method of forming a dual damascene interconnect in accordance with another embodiment of the present invention.

FIGS. 3A-3F illustrate another method of forming an etch-stop-less dual damascene interconnect in accordance with one embodiment of the present invention. In particular FIGS. 3A-3F illustrate a partial-trench first dual damascene process, Fabrication of the dual damascene interconnect begins in FIG. 3A with the substrate 200 having interlayer dielectric 310 formed thereon, similar to FIG. 2A. Metal conductor layer or metal interconnect 410 comprising metal film 411 and cap layer 412 is formed in the interlayer 310. Then, the interlayer dielectric 320 is deposited over the metal interconnect 410 and interlayer dielectric 310. As shown in FIG. 3A, the interlayer dielectric 320 is formed directly onto the metal interconnect 410 and the interlayer dielectric 310 without an intermediate etch stop layer.

Next, a partial trench is formed in the interlayer dielectric 320. In an embodiment of the present invention, fabrication of the partial trench begins by depositing a metal hard mask 740 onto the interlayer dielectric 320 as shown in FIG. 3A. In one embodiment, the metal hard mask 740 is made of titanium or titanium nitride. Subsequently, a ARC 840 is blanket deposited on metal hard mask 740 before a photoresist mask 940 is formed on the ARC 840. Photoresist mask 940 is formed on ARC 840 to define a desired location of the interlayer dielectric 320 to form the partial trench. The ARC 840 and photoresist mask 940 are fabricated by similar techniques used to form ARC 810 and photoresist mask 910 in FIG. 2B.

Figure 3B:
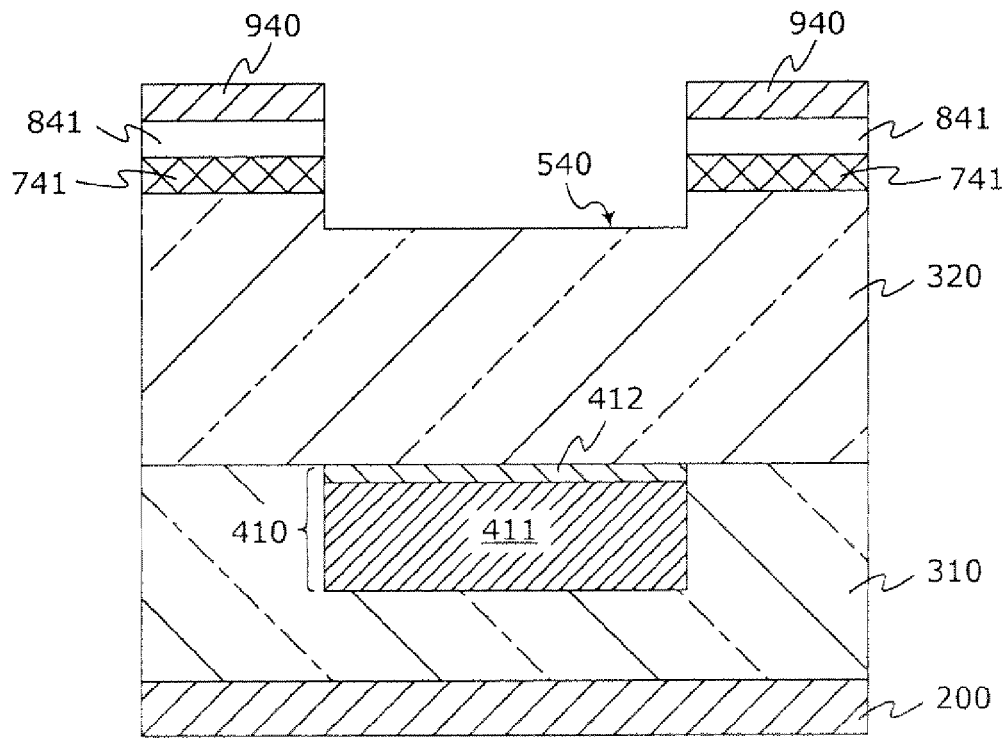

Next, in FIG. 3B, an etching process is performed in alignment with the photoresist mask 940 to form the partial trench 540. Furthermore, the etching process also removes portions of the metal hard mask 740 not covered by the photoresist mask 940 to form metal hard mask 741. The etching process can be time controlled so that the partial trench 540 does not extend through the interlayer dielectric 320 to expose the cap layer 412. In one embodiment, the partial trench 540 is formed to a depth of about one-third of the thickness of the interlayer dielectric 320. After forming the partial trench 540, the photoresist mask 940 and remaining portions 841 of the ARC 840 are removed from the metal hard mask 741.

Figure 3C:
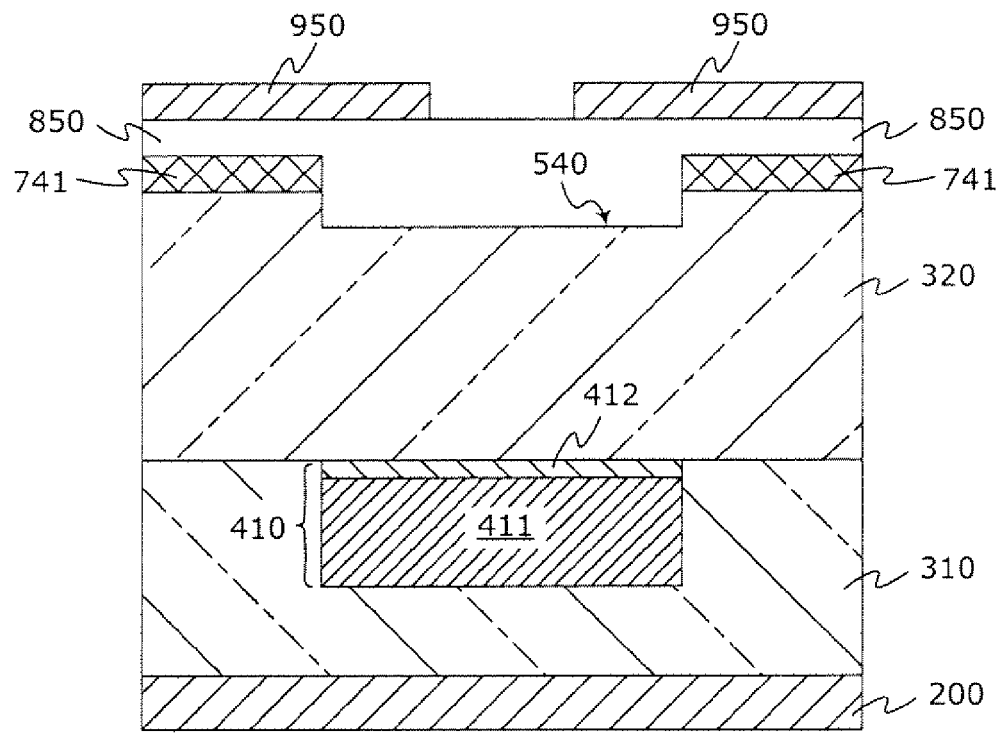

Subsequently, a partial via is formed in the interlayer dielectric 320. After removing the photoresist mask 940 and remaining portions 841 of ARC 840 from the metal hard mask 741, a ARC 850 is deposited into the partial trench 540 and onto the metal hard mask 741 as shown in FIG. 3C. Then, a photoresist mask 950 is formed onto the ARC 850 to define a desired location of interlayer dielectric 320 to form the partial via. The ARC 350 and photoresist mask 950 uses similar fabrication techniques and materials as the ARC 810 and photoresist mask 910 in FIG. 2B, and thus will not be discussed in detail here.

Figure 3D:
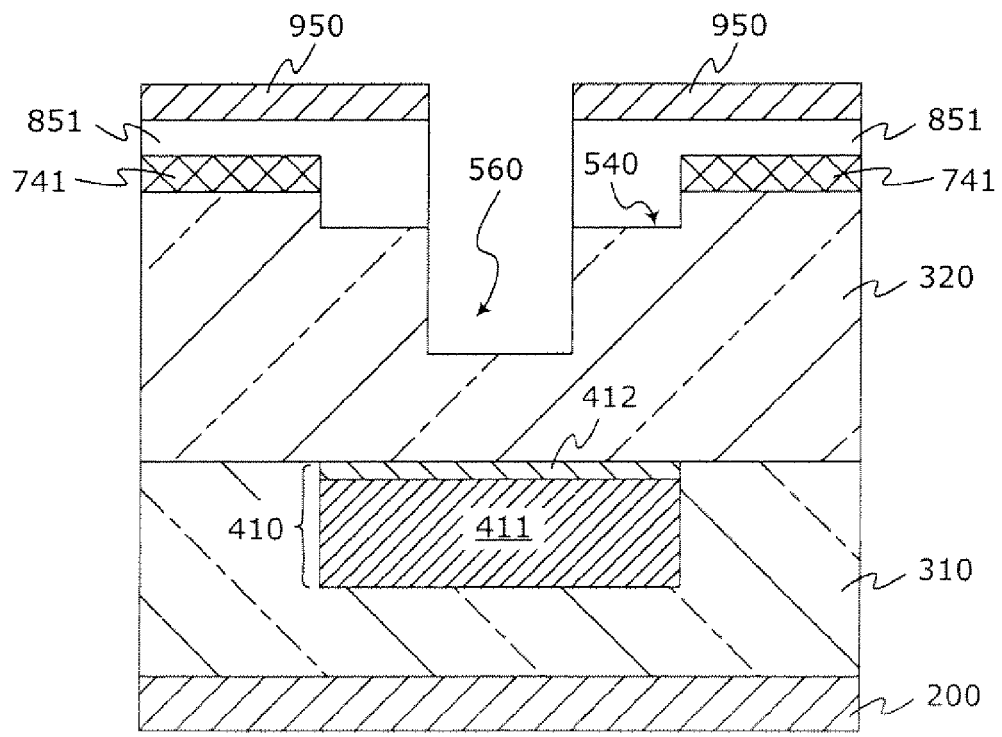
Figure 3E:
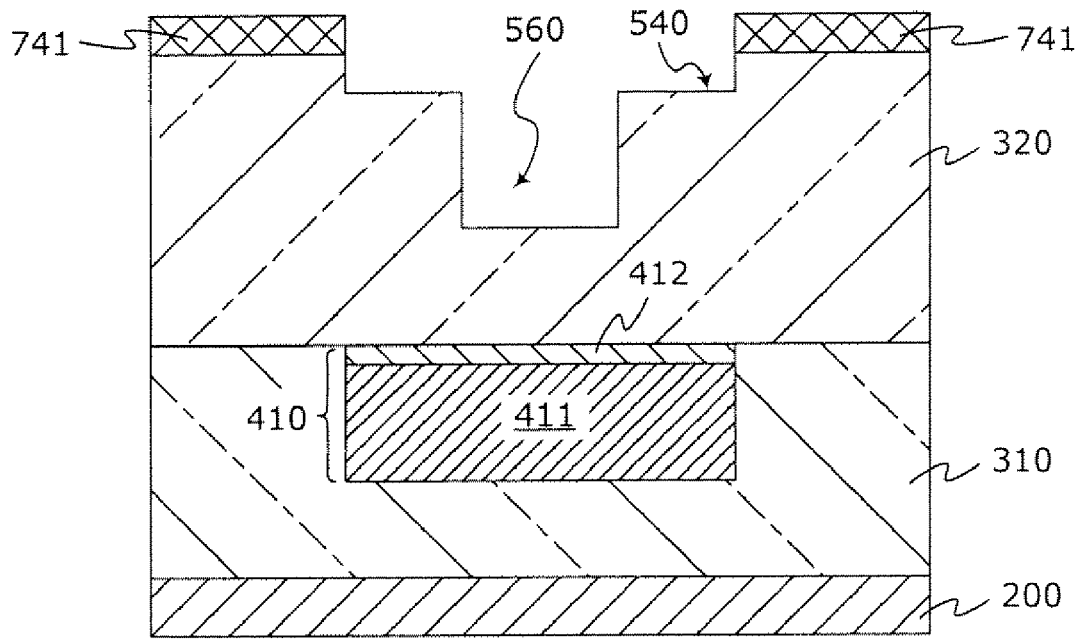

Next, in FIG. 3D, an etching process is performed in alignment with the photoresist mask 940 to form a partial via 560 in the interlayer dielectric 320. Furthermore the etching process also etches portions of the ARC 850 not covered by the photoresist mask 950 so that portions 851 of ARC 850 remains on the metal hard mask 741 and on parts of the partial trench 540. In one embodiment, the partial via 560 is formed to a depth of about half the thickness of the interlayer dielectric 320. After forming the partial via 560, the photoresist mask 950 and remaining portions 851 of the ARC 850 are removed from the metal hard mask 741 and partial trench 540 as shown in FIG. 3E.

Figure 3F:
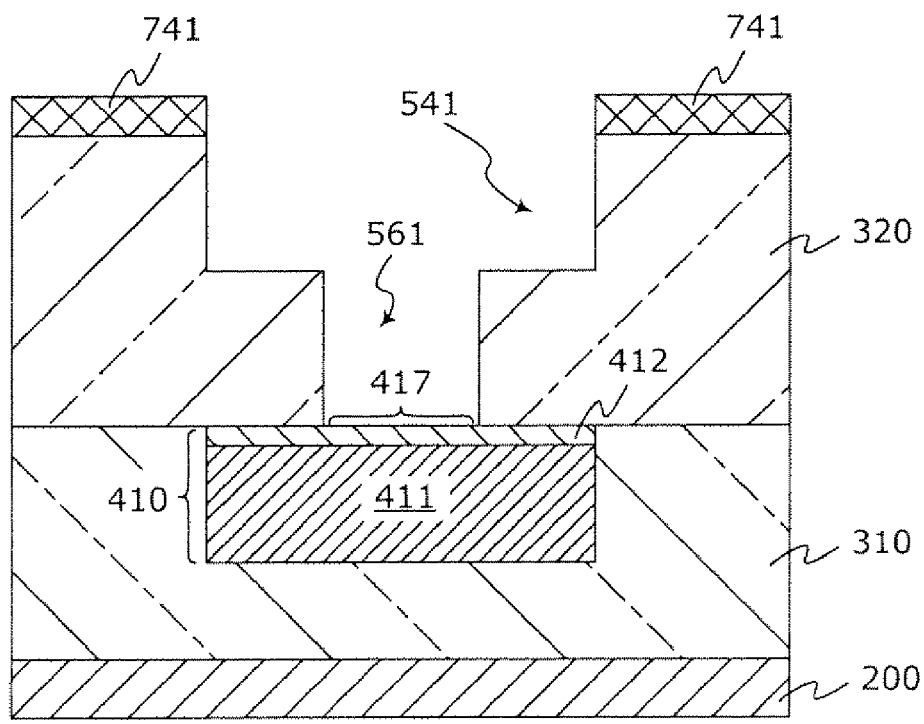

Next, an etching process is performed to form a trench and a via opening that exposes a portion of the cap layer 442. In one embodiment an etching process extends the partial via 560 to the cap layer 412, thus forming the via opening 561 as shown in FIG. 3F. The via opening 561 exposes a portion 471 of the cap layer 412. Furthermore, the etching process also etches the interlayer dielectric 320 in alignment with the metal hard mask 741 to define a trench 541 above the via opening 561. In one embodiment, the etching process extends the partial trench 540 described in FIG. 3E to form the complete trench 541. In one embodiment, the etching process uses a plasma anisotropic etch to form the trench 541 and via opening 561 at the same time. Trench 541 and via opening 561 can be referred to as a dual damascene structure.

After forming both the trench 541 and via opening 561, a removal process similarly described in FIG. 2G is performed to remove the metal hard mask 741 from the interlayer dielectric 320. The removal process utilizes the removal chemistry of the present invention, which has the capability to remove the metal hard mask 741 and is highly selective to exposed portion 417 of the cap layer 412 or any remaining portions of cap layer 412 beneath the dielectric 320. In other words, the removal process etches the hard mask 741 without etching the cap layer 412.

After removing the metal hard mask 741, a metal interconnect is formed onto the exposed portion 417 of cap layer 412 and into the via 561 and trench 541. The method of forming the metal interconnect is similar to FIG. 2H and thus will not be discussed in detail here.

FIGS. 2A-2H and 3A-3F can be used to form a second level interconnect (metal interconnect 420) which contacts a first level interconnect (metal interconnect 410). However, it is to be appreciated that the present invention is not limited to such an application but can be used to form any level of metallization interconnects (metal 1, metal 2, metal 3) which are to make contact with a previously formed metal interconnect.

Furthermore, even though the removal chemistry is described in relation to removing metal hard mask in a dual damascene process as illustrated in FIGS. 2A-2H and 3A-3F, it can be appreciated that the removal chemistry is not limited to the use in a dual damascence process. But can be utilized in other processes that remove titanium or titanium nitride hard masks with high selectivity to copper-alloy or cobalt-alloy layer. For example, the removal chemistry can be used in other processes such as but not limited to forming single damascene structures or forming metal contact structures.

Further, the removal chemistry have the capability to remove post-etch residue generated during the plasma etch step (described in FIGS. 2G and 3F) to form the final dual-damascene structure, thus yielding a clean wafer with low defect counts to increase the process yield.

Several embodiments of the invention have thus been described. However, those ordinarily skilled in the art will recognize that the invention is not limited to the embodiments described, but can be practiced with modification and alteration within the spirit and scope of the appended claims that follow.

We claim:

1. A composition of matter comprising:
an aqueous hard mask removal solution, the aqueous hard mask removal solution comprising:
hydrogen peroxide; and
a hydroxide source; and
a corrosion inhibitor to prevent a metal conductor layer underlying a hard mask from chemically reacting with either the hydrogen peroxide or the hydroxide source, wherein the corrosion inhibitor has a cyclical ring having at least 5 members.

2. The composition of matter of claim 1, wherein the hydrogen peroxide has a concentration of about 3% to 50% by volume in water.

3. The composition of matter of claim 1, wherein the hydroxide source has sufficient concentration level to adjust the pH value of the aqueous solution to be at least 7.3.

4. The composition of matter of claim 3, wherein the hydroxide source has a concentration of about 50 to 1000 parts per million.

5. The composition of matter of claim 1, wherein the hydroxide source is selected from a group consisting of
potassium hydroxide
sodium hydroxide
tetra-methyl-ammonium-hydroxide (TMAH), and
choline hydroxide.

6. The composition of matter of claim 1, wherein the corrosion inhibitor has a concentration of about 100 to 1000 parts per million.

7. The composition of matter of claim 1, wherein the cyclical ring having at least 5 members comprises at least 2 nitrogen atoms.

8. The composition of matter of claim 1, wherein the cyclical ring having at least 5 members does not include a benzene ring (6-carbon ring).

9. The composition of matter of claim 1, wherein the corrosion inhibitor is selected from a group consisting of
imidazole,
1, 2, 3 triazole,
1,2,4 triazole,
methyl-thiol-triazole,
thiol-triazole, and
triazole acid.

10. A method of formulating a hardmask removal chemistry, the method comprising:
providing an aqueous solution of hydrogen peroxide;
mixing a hydroxide source to the aqueous solution of hydrogen peroxide;
mixing a corrosion inhibitor to the aqueous solution of hydrogen peroxide, wherein the
corrosion inhibitor has a cyclical ring having at least 5 members; and
applying the aqueous solution, the hydroxide source, and corrosion mixture to a hardmask.

11. The method of claim 10,
wherein the hydrogen peroxide has a concentration of about 3% to 50% by volume in the aqueous solution;
wherein the hydroxide source has a concentration of about 50 to 1000 parts per million; and
wherein the corrosion inhibitor has a concentration of about 100 to 1000 parts per million.

12. The method of claim 10, wherein the hydroxide source has an amount sufficient to adjust the pH value of the aqueous solution to be at least 7.3.

13. The method of claim 10, wherein the hydroxide source is selected from a group consisting of
potassium hydroxide,
sodium hydroxide,
tetra-methyl-ammonium-hydroxide (TMAH), and
choline hydroxide.

14. The method of claim 10, wherein the cyclical ring has at least 2 nitrogen atoms.

15. The method of claim 10, wherein the cyclical ring does not include a benzene ring (6-carbon ring).

16. The method of claim 10, wherein the corrosion inhibitor is selected from a group consisting of
imidazole,
1,2,3 triazole,
1,2,4 triazole,
methyl-thiol-triazole,
thiol-triazole, and
triazole acid.

* * * * *